(12) United States Patent
Koizumi et al.

(10) Patent No.: US 10,152,839 B2
(45) Date of Patent: Dec. 11, 2018

(54) ANTENNA DRIVING APPARATUS

(71) Applicant: Aisin Seiki Kabushiki Kaisha, Kariya-shi (JP)

(72) Inventors: Takaaki Koizumi, Obu (JP); Takehiro Tabata, Kariya (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 0 days.

(21) Appl. No.: 15/131,057

(22) Filed: Apr. 18, 2016

(65) Prior Publication Data
US 2017/0032603 A1 Feb. 2, 2017

(30) Foreign Application Priority Data

Jul. 30, 2015 (JP) .................. 2015-150939

(51) Int. Cl.
*G05B 19/00* (2006.01)
*H04B 1/04* (2006.01)
(Continued)

(52) U.S. Cl.
CPC ...... *G07C 9/00714* (2013.01); *B60C 23/0452* (2013.01); *B60R 25/2036* (2013.01); *B60R 25/246* (2013.01); *B60R 25/406* (2013.01); *G01D 5/24* (2013.01); *G01R 19/0092* (2013.01); *G07C 9/00309* (2013.01);
(Continued)

(58) Field of Classification Search
CPC .......... E05B 81/78; E05B 81/77; E05B 85/10; E05B 81/76; E05B 85/16; H01Q 1/3241; H01Q 1/3283; H01Q 1/3291; G07C 2209/65; G07C 9/00944; G07C 9/00706; G07C 2009/0019; G07C 2009/00793; G07C 9/00309; G07C 9/00714;
(Continued)

(56) References Cited

U.S. PATENT DOCUMENTS 9,502,756 B2 * 11/2016 Takahashi ............ H01Q 1/3241
2007/0257771 A1 * 11/2007 Moser ..................... B60R 25/24
340/5.61
(Continued)

FOREIGN PATENT DOCUMENTS

| JP | 2009-84829 | 4/2009 |
| JP | 2014-17701 | 1/2014 |
| JP | 2014-506306 | 3/2014 |

*Primary Examiner* — Dionne H Pendleton
(74) *Attorney, Agent, or Firm* — Oblon, McClelland, Maier & Neustadt, L.L.P.

(57) ABSTRACT

An antenna driving apparatus includes: a direct current power source supplying direct current power to a human detecting IC detecting contact to a human detecting area by a user, the power source outputting a power source voltage to a first connecting line connected to a power source terminal of the IC and outputting a reference potential to a second connecting line connected to a GND terminal of the IC; an antenna driving circuit driving an antenna transmitting a signal to a portable device, the antenna driving circuit outputting a first antenna drive signal to the first connecting line and outputting an antenna drive signal; and a control unit performing switching control of the power source voltage and the antenna drive signal to be output to the first and second connecting lines and switching control of the antenna driving circuit.

6 Claims, 5 Drawing Sheets

(51) Int. Cl.
  *G07C 9/00* (2006.01)
  *B60C 23/04* (2006.01)
  *B60R 25/24* (2013.01)
  *B60R 25/20* (2013.01)
  *B60R 25/40* (2013.01)
  *G01D 5/24* (2006.01)
  *G01R 19/00* (2006.01)
  *H01Q 1/32* (2006.01)

(52) U.S. Cl.
  CPC ......... *H01Q 1/3241* (2013.01); *H01Q 1/3283* (2013.01); *H04B 1/0458* (2013.01); *G07C 2009/0019* (2013.01); *G07C 2009/00793* (2013.01); *G07C 2209/65* (2013.01)

(58) Field of Classification Search
  CPC . B60R 25/2036; B60R 25/246; B60R 25/406; G01D 5/24; G01R 19/0092
  See application file for complete search history.

(56) References Cited

U.S. PATENT DOCUMENTS

| | | | |
|---|---|---|---|
| 2009/0284082 A1* | 11/2009 | Mohammadian | G06K 7/0008 307/104 |
| 2014/0015597 A1 | 1/2014 | Tabata et al. | |
| 2014/0022013 A1* | 1/2014 | Tabata | H04B 1/0458 330/251 |
| 2014/0077926 A1 | 3/2014 | Leconte | |
| 2015/0079914 A1* | 3/2015 | Takahashi | H01Q 1/3241 455/127.2 |

* cited by examiner

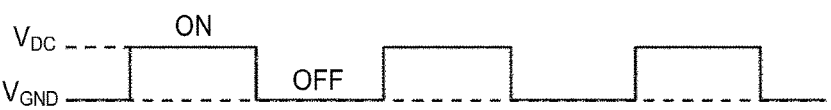
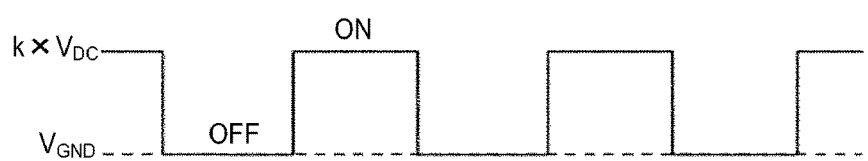
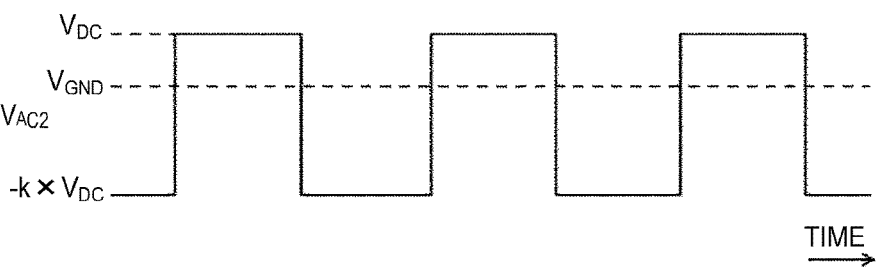
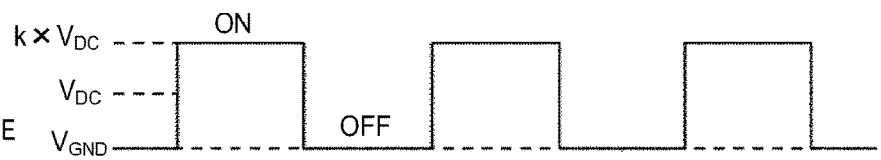
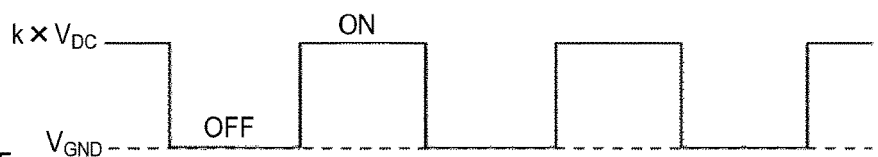
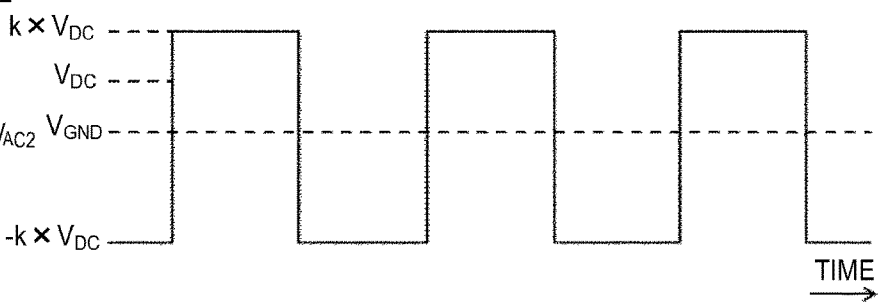

ANTENNA DRIVING APPARATUS

CROSS REFERENCE TO RELATED APPLICATIONS

This application is based on and claims priority under 35 U.S.C. § 119 to Japanese Patent Application 2015-150939, filed on Jul. 30, 2015, the entire contents of which are incorporated herein by reference.

TECHNICAL FIELD

This disclosure relates to an antenna driving apparatus configured to drive an antenna for transmitting and receiving authentication information with a smart key in a so-called smart key system.

BACKGROUND DISCUSSION

Nowadays, vehicles equipped with a so-called smart key system have spread through the market in response to requirements of convenience and safety. The smart key system is configured to exchange authentication information between a portable device (smart key) carried by a user of a vehicle and a vehicle-mounted apparatus by radio when the user approaches or contacts a vehicle opening-and-closing member such as a vehicle door and to automatically lock and unlock the vehicle opening-and-closing member when the authentication information matches (For example, see JP 2009-084829A).

The smart key system of the related art generally includes (1) an antenna for exchanging authentication information with a portable device carried by a user of a vehicle, (2) a human detecting IC that detects contact to a human detecting area provided near a vehicle opening-and-closing member by the user, and (3) an ECU (Electronic Control Unit) that drives and controls the antenna and the human detecting IC.

However, with the configuration of the related art as described above, a number of connecting lines are required for connecting components. Therefore, there arises a problem of increases in size and costs of the apparatus. For example, the configuration disclosed in JP 2009-084829A requires at least six harnesses having a length of 5 to 8 m.

As the related art for solving the above-described problem, there is proposed an apparatus which is reduced in size and costs by integrating an antenna and a human detecting IC in one vehicle-mounted apparatus and superimposing a direct current power source voltage for the human detecting IC, a human detecting signal, and an antenna drive signal on a single connecting line for transmission. (For example, see JP 2014-506306T). In JP 2014-506306T, a central processing unit (3) and an electronic communication module (2) are connected by two wires (4 and 5), and a DC voltage and the antenna drive signal are switchably output therefrom to avoid an increase of the maximum value of the signals superimposed on the wires (4 and 5).

With the antenna driving apparatus configured to switchably output the DC voltage and the antenna drive signal from the same connecting line as disclosed in JP 2014-506306T, capacitors (38 and 39) need to be provided between the wires (4 and 5) and a low-frequency voltage generator (30) so as to prevent a current caused by the DC voltage and output to the wires (4 and 5) from flowing reversely toward the low-frequency voltage generator (30). However, since the capacitors (38 and 39) having a large capacitance need to be provided in order to reduce an effect of a resonant circuit of the antenna on impedance, the apparatus has a problem of an increase in costs.

When the capacitors (38 and 39) are provided, the antenna drive signal charged in the capacitors (38 and 39) is superimposed on the DC voltage when the output to the electronic communication module (2) is switched from the antenna drive signal to the DC voltage, and a voltage which is a sum of the antenna drive signal and the DC voltage is applied to the electronic communication module (2). Consequently, the electronic communication module (2) is required to have a larger rating, and thus the apparatus has a problem of a further increase in costs.

SUMMARY

Thus, a need exists for a low-cost antenna driving apparatus which is not suspectable to the drawback mentioned above.

An antenna driving apparatus according to a first aspect of this disclosure includes: a direct current power source configured to supply direct current power to a human detecting IC configured to detect contact to a human detecting area of a vehicle by a user of the vehicle, the direct current power source outputting a direct current power source voltage to a first connecting line electrically connected to a power source terminal of the human detecting IC and outputting a reference potential to a second connecting line electrically connected to a GND terminal of the human detecting IC; an antenna driving circuit configured to drive an antenna that transmits a signal to a portable device carried by the user, the antenna driving circuit outputting a first antenna drive signal generated by switching between the direct current power source voltage and the reference potential to the first connecting line electrically connected to one end of the antenna and outputting a potential difference between a second antenna drive signal and the first antenna drive signal to be output to the second connecting line electrically connected to the other end of the antenna to the antenna as an antenna drive signal; and a control unit configured to perform switching control of the direct current power source voltage and the antenna drive signal to be output to the first connecting line and the second connecting line and to perform switching control of the antenna driving circuit.

An antenna driving apparatus according to a second aspect of this disclosure includes: a direct current power source configured to supply direct current power to a human detecting IC configured to detect contact to a human detecting area of a vehicle by a user of the vehicle, the direct current power source outputting a direct current power source voltage to a first connecting line electrically connected to a power source terminal of the human detecting IC and outputting a reference potential to a second connecting line electrically connected to a GND terminal of the human detecting IC; an antenna driving circuit configured to drive an antenna that transmits a signal to a portable device carried by the user, the antenna driving circuit outputting an antenna drive signal to the first connecting line electrically connected to one end of the antenna and the second connecting line electrically connected to the other end of the antenna, a protective diode connected between the direct current power source and the antenna driving circuit and configured to prevent a current caused by the direct current power source voltage from flowing reversely toward the direct current power source via the antenna driving circuit; and a control unit configured to perform switching control of the direct current power source voltage and the antenna drive signal to be output to the first connecting line and the second connecting line and to perform switching control of the antenna driving circuit.

BRIEF DESCRIPTION OF THE DRAWINGS

The foregoing and additional features and characteristics of this disclosure will become more apparent from the following detailed description considered with the reference to the accompanying drawings, wherein:

FIGS. 3A to 3C are schematic views of waveforms of antenna drive signals output from the antenna driving apparatus according to Embodiment 1 disclosed here;

FIGS. 4A to 4C are schematic views of waveforms of antenna drive signals output from the antenna driving apparatus of the related art;

DETAILED DESCRIPTION

Figure 1:
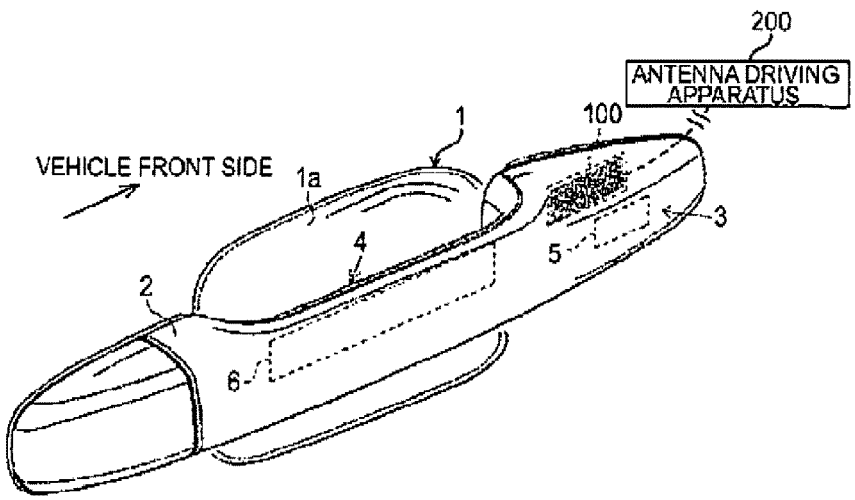
FIG. 1 is a perspective view of a vehicle opening-and-closing member including a vehicle-mounted apparatus controlled by an antenna driving apparatus according to Embodiment 1 disclosed here, and is a schematic drawing illustrating an example of a case where a vehicle door is used as the vehicle opening-and-closing member.

Exemplary embodiments for implementing this disclosure will be described in detail with reference to the drawings. Dimensions, materials, shapes, relative positions among components described embodiments given below are optional and may be modified according to the structure of the apparatus and various conditions to which this disclosure is applied. Unless otherwise specifically noted, the scope of this disclosure is not limited to modes described in the embodiments described below. In the drawings which will be described below, same components having the same functions are denoted by the same reference numerals, and repeated descriptions may be omitted.

Embodiment 1

FIG. 1 is a perspective view of a vehicle opening-and-closing member including a vehicle-mounted apparatus 100 controlled by an antenna driving apparatus 200 according to Embodiment 1 disclosed here, and is a schematic drawing illustrating an example of a case where a vehicle door is used as the vehicle opening-and-closing member. The vehicle opening-and-closing member of Embodiment 1 is not limited to the vehicle door illustrated in FIG. 1, and includes, for example, a lid of a vehicle rear trunk, a lid of a vehicle front hood, a lid of an oil feeding plug, and the like. In the following description, the vehicle-mounted apparatus 100, which is assumed to be the vehicle door, will be described with reference to FIG. 1.

As illustrated in FIG. 1, a door handle 2 of the vehicle door is installed outside a door panel 1, which constitutes part of the vehicle door, so as to extend in a fore-and-aft direction of a vehicle. The door handle 2 is attached to the door panel 1 at two positions; front and rear. The door handle 2 is formed into a hollow shape having an inner space by, for example, resin molding. The door panel 1 is provided with a depression 1a at a position opposing the door handle 2 to allow a human hand to easily grip the door handle 2 near the center thereof as illustrated in FIG. 1.

An unlocking area 4 for unlocking the vehicle door and a locking area 3 for locking the vehicle door are provided on an outer peripheral surface of the door handle 2 as a human detecting area for detecting contact thereto by a user of the vehicle. For example, in FIG. 1, the unlocking area 4 is provided on a grip portion of the door handle 2 along an electrostatic capacitance type unlock sensor electrode 6 mounted in the door handle 2. The locking area 3 is provided on the vehicle front side with respect to the unlocking area 4 along an electrostatic capacitance type lock sensor electrode 5 mounted in the door handle 2. FIG. 1 illustrates an example in which the locking area 3 is provided on the vehicle front side with respect to the unlocking area 4. However, the locking area 3 may be provided on a vehicle rear side with respect to the unlocking area 4.

The vehicle-mounted apparatus 100 electrically connected to the lock sensor electrode 5 and the unlock sensor electrode 6 is mounted in the interior of the door handle 2. The vehicle-mounted apparatus 100 is driven and controlled by the antenna driving apparatus 200 provided outside the door handle 2. When a user of the vehicle contacts the locking area 3, the antenna driving apparatus 200 detects the contact from a capacitance change of the lock sensor electrode 5, and brings the door handle 2 to be locked or a lockable state. When a user of the vehicle contacts the unlocking area 4, the antenna driving apparatus 200 detects the contact from a capacitance change of the unlock sensor electrode 6, and brings the door handle 2 to be unlocked or an unlockable state.

The lock sensor electrode 5 and the unlock sensor electrode 6 are not limited to be the electrostatic capacitance type and, for example, a pressure sensor, an infrared ray sensor, or a proximity sensor such as a radio frequency identifier (RFID) is also applicable. In FIG. 1, the lock sensor electrode 5 and the unlock sensor electrode 6 have a substantially rectangular strip shape, and the unlock sensor electrode 6 is larger than the lock sensor electrode 5. However, Example 1 is not limited to have such a configuration. Both of the lock sensor electrode 5 and the unlock sensor electrode 6 do not necessarily have to be provided, and a configuration having only one of these electrodes is also applicable.

Figure 2:
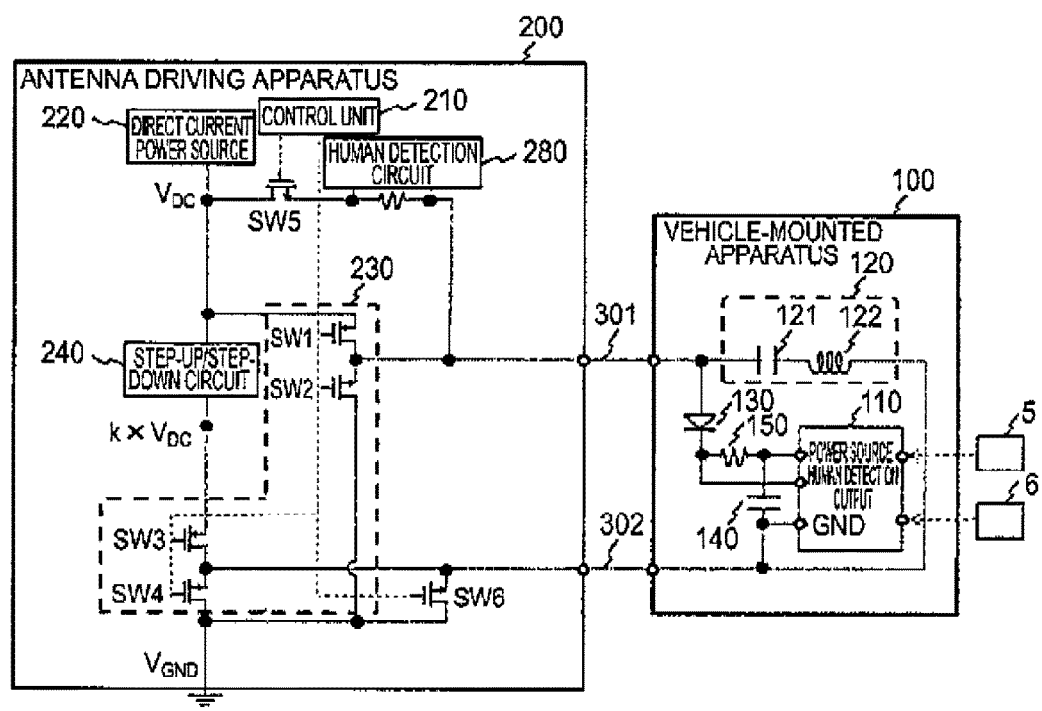
FIG. 2 is a schematic drawing illustrating a circuit configuration of the antenna driving apparatus according to Embodiment 1 disclosed here together with the vehicle-mounted apparatus.

FIG. 2 is a schematic drawing illustrating a circuit configuration of the antenna driving apparatus 200 according to Embodiment 1 disclosed here together with the vehicle-mounted apparatus 100. The antenna driving apparatus 200 of Embodiment 1 includes a control unit 210, a direct current power source 220, an antenna driving circuit 230, a step-up/step-down circuit 240, and a human detection circuit 280. The vehicle-mounted apparatus 100 includes a human detection IC 110, an antenna 120, a rectifier diode 130, a smoothing capacitor 140, and a protective resistance 150.

The antenna driving apparatus 200 of Embodiment 1 illustrated in FIG. 2 is characterized in that a capacitor is not connected between a first connecting line 301 and the antenna driving circuit 230, and in that the step-up/step-down circuit 240 steps up and down only an output to a second connecting line 302. The step-up/step-down circuit 240 illustrated in FIG. 2 may have either one or both of the stepping up function and the stepping down function. Referring now to FIG. 2, a configuration and an operation of Embodiment 1 will be described below.

The vehicle-mounted apparatus 100 is mounted near the vehicle opening-and-closing member. For example, in FIG. 1, the vehicle-mounted apparatus 100 is mounted in the interior of the door handle 2. In contrast, since the antenna driving apparatus 200 concurrently performs control other than locking and unlocking of the vehicle opening-and-closing member, the antenna driving apparatus 200 is often installed at a position away from the vehicle opening-and-closing member, but may be installed in the vicinity of the vehicle opening-and-closing member. The vehicle-mounted apparatus 100 and the antenna driving apparatus 200 are electrically connected to each other by the first connecting line 301 and the second connecting line 302.

Table 1 is a logical value table indicating ON/OFF state of switches SW1 to SW6 when the antenna driving apparatus 200 of Embodiment 1 disclosed here performs switching control of an output signal. For example, a transistor element such as an FET (Field Effect Transistor) may be used as the switches SW1 to SW6. The switch SW6 may be shared with the switch SW4.

TABLE 1

| | | SW1 | SW2 | SW3 | SW4 | SW5 | SW6 |
|---|---|---|---|---|---|---|---|
| When antenna is not driven | | | OFF | | | ON | ON |
| When antenna is driven | STATE 1 | ON | OFF | OFF | ON | OFF | OFF |
| | STATE 2 | OFF | ON | ON | OFF | | |

When the antenna is not driven, the control unit 210 of the antenna driving apparatus 200 turns the switches SW1 to SW4 of the antenna driving circuit 230 to OFF state and turns the switch SW5 and the switch SW6 to ON state in accordance with the logical value table shown in Table 1. Consequently, the direct current power source voltage $V_{DC}$ that the direct current power source 220 outputs is supplied to the human detection IC 110 of the vehicle-mounted apparatus 100 via the first connecting line 301. A reference potential $V_{GND}$ is output to the second connecting line 302.

For example, a vehicle-mounted battery may be used as the direct current power source 220. In the case where a desired direct current power source voltage $V_{DC}$ cannot be obtained due to the standard of the vehicle that specifies the voltage value of the vehicle-mounted battery, another step-up/step-down circuit different from the step-up/step-down circuit 240 may be connected in series with the vehicle-mounted battery voltage to step up and step down the battery voltage, so that a desired direct current power source voltage $V_{DC}$ is obtained.

When the lock sensor electrode and the unlock sensor electrode detect contact to the human detecting area on the vehicle opening-and-closing member by a user of the vehicle, the human detection IC 110 superimposes a human detecting signal on the first connecting line 301 and notifies the contact to the control unit 210 of the antenna driving apparatus 200. Here, a specific method of superimposing the human detecting signal on the first connecting line 301 may include, for example, providing switching means and a resistive element in the interior of the human detection IC 110 and dropping the direct current power source voltage $V_{DC}$ for a certain period. In this case, lock and unlock can be recognized by a difference in magnitude of the voltage drop or by a length of a voltage drop period.

When the human detecting signal superimposed on the first connecting line 301 is detected by using the human detection circuit 280, the control unit 210 switches the signal output from the antenna driving apparatus 200 from the direct current power source voltage $V_{DC}$ to an antenna drive signal $V_{AC}$. Specifically, the control unit 210 turns the switch SW5 and the switch SW6 to OFF state and performs switching control of the switches SW1 to SW4 of the antenna driving circuit 230 to State 1 and State 2 in a resonance period of the antenna 120 in accordance with the logical value table shown in Table 1. Note that the antenna driving circuit 230 of Embodiment 1 is not limited to an H-bridge circuit as illustrated in FIG. 2 and, for example, may be a half bridge circuit.

FIGS. 3A to 3C are schematic views of a waveform of an antenna drive signal $V_{AC}$ output from the antenna driving apparatus 200 according to Embodiment 1 disclosed here. The antenna driving circuit 230 of Embodiment 1 generates a first antenna drive signal $V_{AC1}$ to be output to the first connecting line 301 by switching the direct current power source voltage $V_{DC}$ and the reference potential $V_{GND}$ as illustrated in FIG. 2. Consequently, the ON voltage of the first antenna drive signal $V_{AC1}$ output to the first connecting line 301 is the same value as the direct current power source voltage $V_{DC}$ as a waveform in FIG. 3A.

In contrast, since a second antenna drive signal $V_{AC2}$ output to the second connecting line 302 is generated by switching between a voltage stepped up and down to k times (k is a real number) by the step-up/step-down circuit 240 and the reference potential $V_{GND}$, ON voltage of the second antenna drive signal $V_{AC2}$ output to the second connecting line 302 is k times the direct current power source voltage $V_{DC}$ as a waveform in FIG. 3B.

Consequently, an amplitude of an antenna drive signal $V_{AC}=V_{AC1}-V_{AC2}$ output to the antenna 120 is (1+k)/2 times the direct current power source voltage $V_{DC}$ as a waveform in FIG. 3C. The antenna drive signal $V_{AC}$ illustrated in FIGS. 3A to 3C is shown by rectangular waves for easy understanding. However, since the antenna drive signal $V_{AC}$ applied to the antenna 120 is filtered by a series resonance circuit of the antenna 120, the antenna drive signal $V_{AC}$ actually has a waveform close to a sine wave.

In this manner, in Embodiment 1, even when the amplitude of the antenna drive signal $V_{AC}$ is changed by the step-up/step-down pressure, the ON voltage of the first antenna drive signal $V_{AC1}$ output to the first connecting line 301 is maintained to the same value as the direct current power source voltage $V_{DC}$ output by the direct current power source 220. Therefore, a current does not flow reversely toward the direct current power source 220 via the antenna drive circuit 230, and the capacitor between the first connecting line 301 and the antenna driving circuit 230 is no longer necessary. A step-up/step-down ratio k of the step-up/step-down circuit 240 is determined so that both amplitudes $(1+k) \times V_{DC}$ of the antenna drive signal $V_{AC}$ becomes a voltage width required by the antenna 120.

In contrast, FIGS. 4A to 4C are schematic views of a waveform of the antenna drive signal $V_{AC}$ output from the antenna driving apparatus of the related art. In the antenna driving apparatus of the related art, both of the first antenna drive signal $V_{AC1}$ output to the first connecting line 301 and the second antenna drive signal $V_{AC2}$ output to the second connecting line 302 are stepped up and down to k times as waveforms in FIGS. 4A and 4B. Consequently, the amplitude of the antenna drive signal $V_{AC}$ output to the antenna 120 is k times the direct current power source voltage $V_{DC}$ as a waveform in FIG. 4C.

In this manner, in the related art, when the amplitude of the antenna drive signal $V_{AC}$ is changed by the step-up/step-down pressure, the ON voltage of the first antenna drive signal $V_{AC1}$ output to the first connecting line 301 becomes different from the direct current power source voltage $V_{DC}$ output by the direct current power source 220. Therefore, a capacitor having a large capacitance is required for preventing a current from flowing reversely toward the direct current power source 220 via the antenna driving circuit 230.

In Embodiment 1, a capacitor 290 having a large capacitance may be eliminated, and thus a reduction in costs of the apparatus is achieved. As a consequence, when the output to the vehicle-mounted apparatus 100 is switched from the antenna drive signal $V_{AC}$ to the direct current power source voltage $V_{DC}$, the antenna drive signal $V_{AC}$ charged in the capacitor 290 is superimposed on the direct current power source voltage $V_{DC}$ and thus is not applied to the human detection IC 110 of the vehicle-mounted apparatus 100. Therefore, a rating of the human detection IC 110 may be lowered to achieve further reduction in costs of the apparatus.

The antenna 120 is provided with a series resonance circuit including a resonance capacitor 121 and an antenna coil 122 connected in series. FIG. 2 illustrates a configuration in which the resonance capacitor 121 side of the antenna 120 is connected to the first connecting line 301, and the antenna coil 122 side of the antenna 120 is connected to the second connecting line 302. However, the order of connection of the resonance capacitor 121 and the antenna coil 122 does not have to be considered.

The antenna 120 of the vehicle-mounted apparatus 100 illustrated in FIG. 2 resonates with the antenna drive signal $V_{AC}$ output from the antenna driving apparatus 200 via the first connecting line 301 and the second connecting line 302 to exchange authentication information for locking and unlocking the vehicle opening-and-closing member with the portable device (smart key) that the user of the vehicle carries by radio. A known technology may be used for modulating the authentication information to the antenna drive signal $V_{AC}$. A configuration providing the antenna 120 only with a transmitting function which needs to be driven and providing a receiving antenna having a different configuration is also applicable.

When the authentication information output from the portable device that the user carries is authenticated, the control unit 210 turns the switches SW1 to SW4 of the antenna driving apparatus 200 to OFF state and turns the switch SW5 and the switch SW6 to ON state in accordance with the logical value table shown in Table 1 to switch the output from the antenna driving apparatus 200 again from the antenna drive signal $V_{AC}$ to the direct current power source voltage $V_{DC}$. The control unit 210 controls the human detection IC 110 to lock and unlock the door handle 2 or to bring the door handle 2 into a potentially lockable or unlockable state. For example, the method employed in the case of the human detecting signal described above may be employed also as a communication method between the control unit 210 and the human detection IC 110.

The rectifier diode 130, the smoothing capacitor 140, and the protective resistance 150 of the vehicle-mounted apparatus 100 illustrated in FIG. 2 constitute a rectifier circuit for AC/DC conversion of the antenna drive signal $V_{AC}$. Accordingly, the antenna drive signal $V_{AC}$ is rectified by the rectifier diode 130 and is smoothened by the smoothing capacitor 140, and electric power is supplied to the human detection IC 110. Therefore, the human detection IC 110 is capable of continuing a human detection function even when the antenna is driven and thus the direct current power source voltage $V_{DC}$ is not supplied to the human detection IC 110.

As described above, in Embodiment 1, the antenna drive signal to be output to the first connecting line, which switchably outputs the direct current power source voltage and the antenna drive signal, is generated by switching the direct current power source voltage and the reference potential. Accordingly, ON voltage of the antenna drive signal output to the first connecting line is maintained at the same value as the direct current power source voltage that the direct current power source outputs even though the amplitude of the antenna drive signal changes. Therefore, the capacitor does not have to be provided between the first connecting line and the antenna driving circuit. Consequently, a low-cost antenna driving apparatus capable of switchably outputting the direct current power source voltage and the antenna drive signal from the same connecting line without using a capacitor having a large capacitance is obtained.

Embodiment 2

Figure 5:
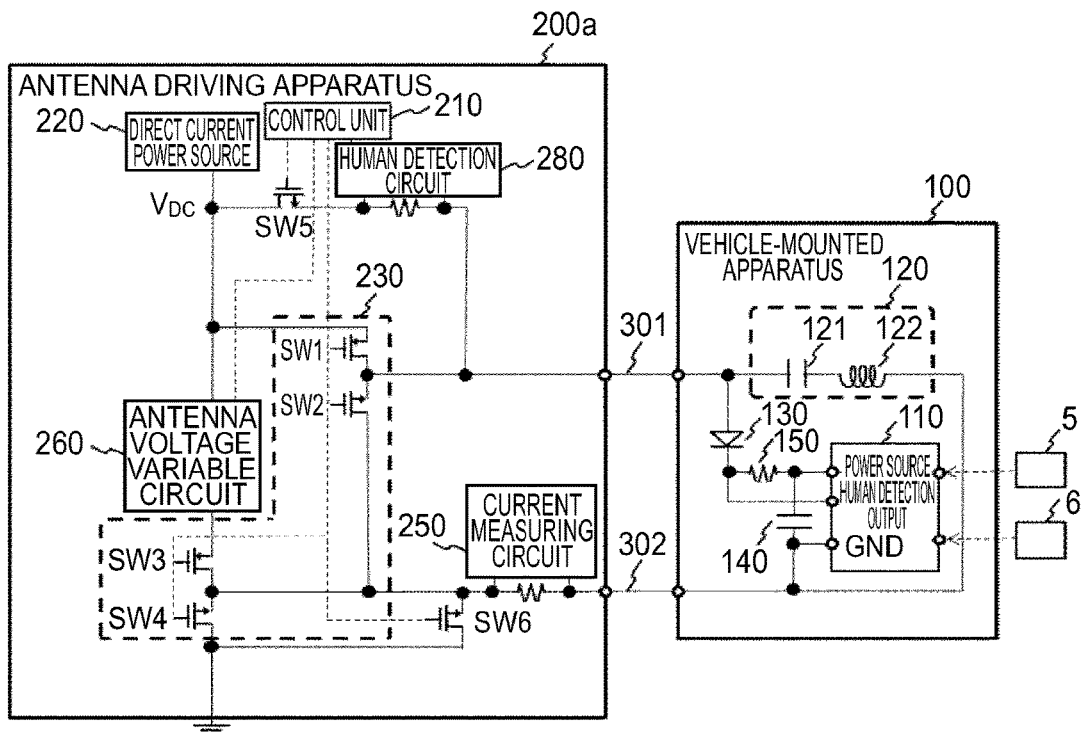
FIG. 5 is a first schematic drawing illustrating a circuit configuration of an antenna driving apparatus according to Embodiment 2 disclosed here together with the vehicle-mounted apparatus.

FIG. 5 is a first schematic drawing illustrating a circuit configuration of an antenna driving apparatus 200a according to Embodiment 2 disclosed here together with the vehicle-mounted apparatus 100. The antenna driving apparatus 200a of Embodiment 2 illustrated in FIG. 5 is different from the antenna driving apparatus 200 of Embodiment 1 described above and illustrated in FIG. 2 in that a current measuring circuit 250 and an antenna voltage variable circuit 260 are provided instead of the step-up/step-down circuit 240. Other configurations and operations are the same as those of Embodiment 1 described above, and thus will not be described again.

The current measuring circuit 250 measures an antenna current $I_{AC}$ flowing in the antenna 120. The antenna voltage variable circuit 260 varies the direct current power source voltage $V_{DC}$ or stepped up and down voltage so that a measured value of the antenna current $I_{AC}$ becomes equal to a current value required by the antenna 120, and outputs the varied voltage to the antenna driving circuit 230.

The control unit 210 generates the second antenna drive signal $V_{AC2}$ to be output to the second connecting line 302 by performing the switching control of the voltage varied by the antenna voltage variable circuit 260 and the reference potential $V_{GND}$ to State 1 and State 2 in a resonance period of the antenna 120 in accordance with the logical value table shown in Table 1. Accordingly, for example, modulation of an amplitude of an output of the antenna 120 and detection and suppression of overcurrent flowing in the antenna 120 are enabled.

As described thus far, according to Embodiment 2, the antenna drive signal to be output to the first connecting line is generated by performing the switching control of the direct current power source voltage and the reference potential, and the antenna drive signal to be output to the second connecting line is generated by performing the switching control of the voltage varied by the antenna voltage variable circuit and the reference potential. Consequently, even though the amplitude of the antenna drive signal is temporarily varied to control a desired antenna current to flow to an antenna, the ON voltage of the antenna drive signal is maintained at the same value as the direct current power source voltage that the direct current power source outputs. Therefore, the low-cost antenna driving apparatus capable of switching the output from the same connecting line between the direct current power source voltage and the antenna drive signal is obtained without using a capacitor having a large capacitance.

Figure 7:
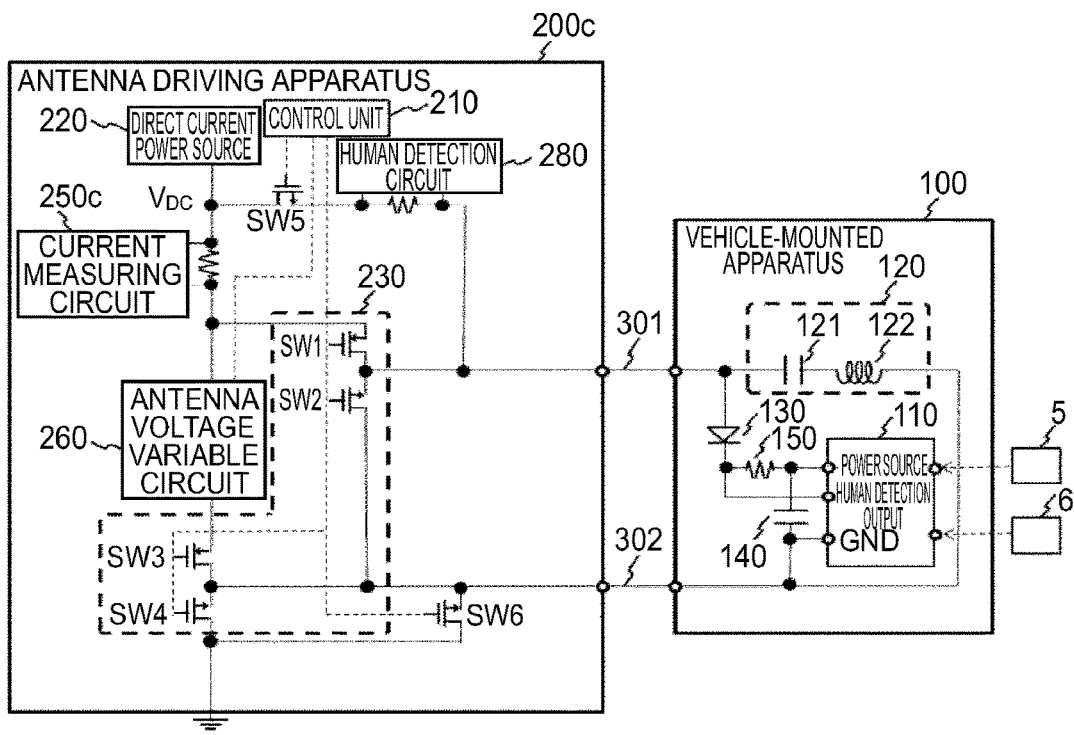
FIG. 7 is a third schematic drawing illustrating a circuit configuration of the antenna driving apparatus according to Embodiment 2 disclosed here together with the vehicle-mounted apparatus.
Figure 8:
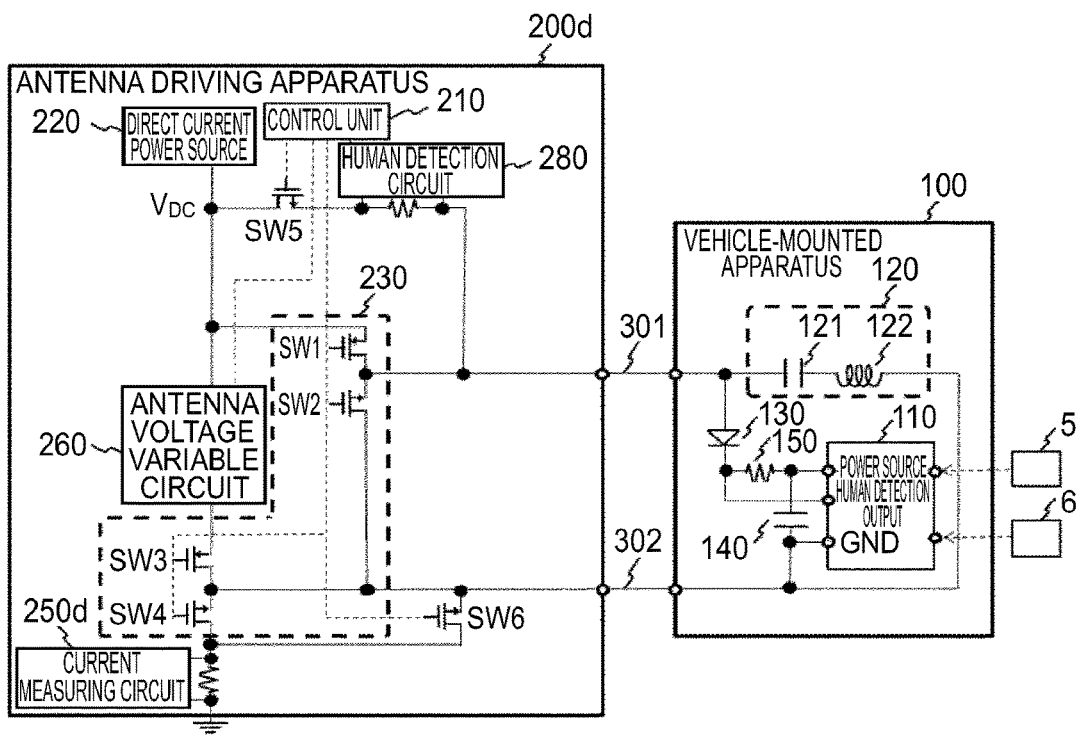
FIG. 8 is a fourth schematic drawing illustrating a circuit configuration of the antenna driving apparatus according to Embodiment 2 disclosed here together with the vehicle-mounted apparatus.

Note that the current measuring circuit 250 does not necessarily have to be connected in series with the second connecting line 302 as illustrated in FIG. 5, and may be provided at other positions as long as the antenna current $I_{AC}$ can be measured. For example, the current measuring circuit 250 may be connected to the first connecting line 301 in series as illustrated in FIG. 6, may be connected to a power source line of the antenna driving circuit 230 in series as illustrated in FIG. 7, and may be connected to a ground line of the antenna driving circuit 230 in series as illustrated in FIG. 8.

Figure 6:
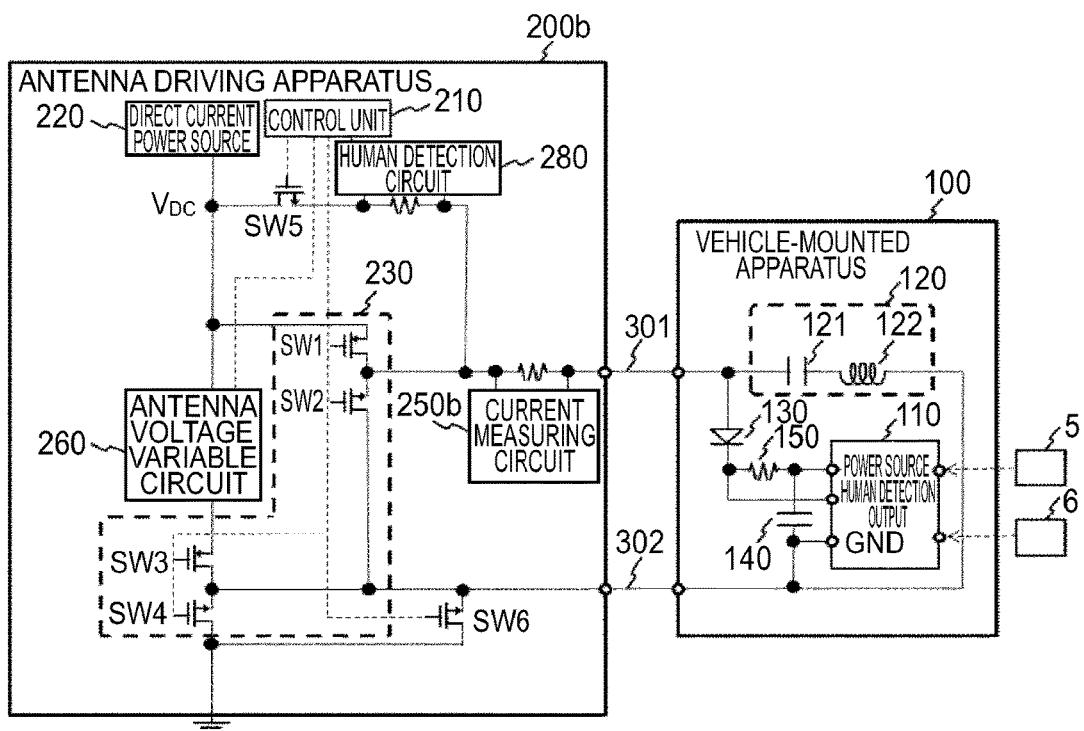
FIG. 6 is a second schematic drawing illustrating a circuit configuration of the antenna driving apparatus according to Embodiment 2 disclosed here together with the vehicle-mounted apparatus.

In particular, with the configurations illustrated in FIG. 5 and FIG. 6, a damping resistance for regulating impedance of the antenna 120 connected to the first connecting line 301 or to the second connecting line 302 in series may be concurrently used as a resistance for measuring the antenna current $I_{AC}$. Therefore, a reduction in costs of the apparatus is achieved.

The configuration of Embodiment 2 may concurrently employ the configuration of Embodiment 1 described above. In other words, if the antenna drive signal $V_{AC}$ is stepped up and down by using the step-up/step-down circuit 240 and then the antenna drive signal $V_{AC}$ is further varied by using the antenna voltage variable circuit 260, the output of the antenna drive signal $V_{AC}$ can be controlled further flexibly.

In contrast, the antenna voltage variable circuit 260 may be integrated with the step-up/step-down circuit 240 to achieve variable control of the step-up/step-down voltage by the step-up/step-down circuit 240, or the antenna voltage variable circuit 260 may be integrated with the antenna driving circuit 230 to achieve variable control of an ON resistance value and a Duty ratio of the switches SW1 to SW4 of the antenna driving circuit 230.

Embodiment 3

Figure 9:
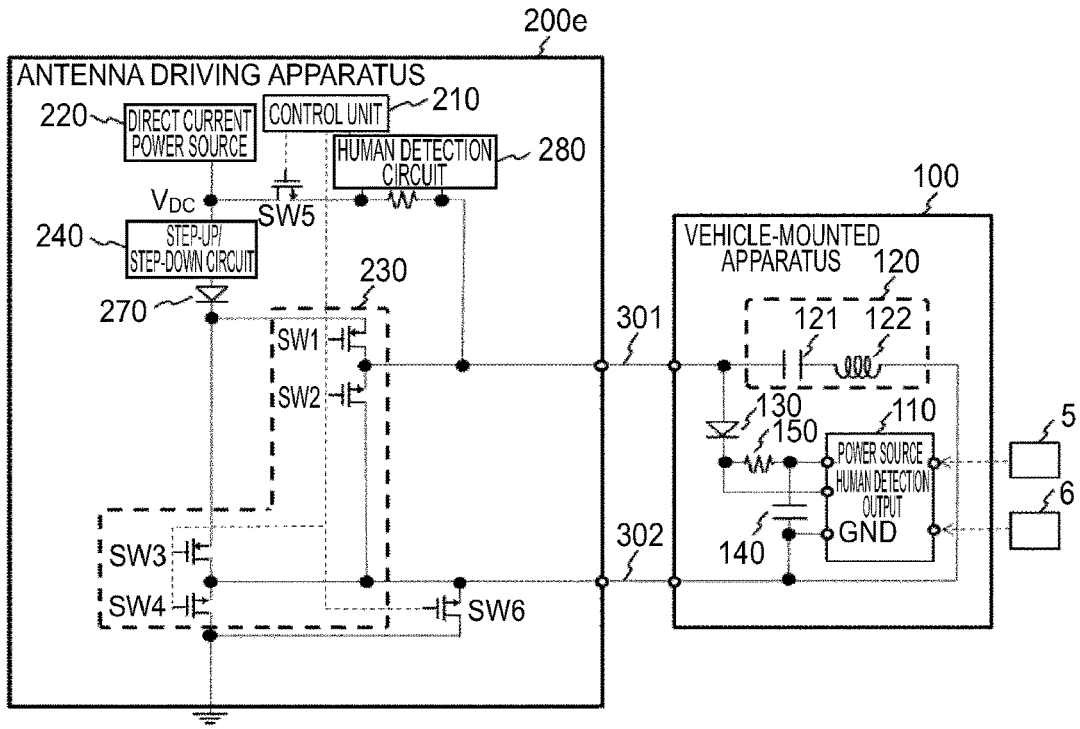
FIG. 9 is a schematic drawing illustrating a circuit configuration of an antenna driving apparatus according to Embodiment 3 disclosed here together with the vehicle-mounted apparatus.

FIG. 9 is a schematic drawing illustrating a circuit configuration of an antenna driving apparatus 200e according to Embodiment 3 disclosed here together with the vehicle-mounted apparatus 100. The antenna driving apparatus 200e of Embodiment 3 illustrated in FIG. 9 is different from the antenna driving apparatus 200 of Embodiment 1 described above as illustrated in FIG. 2 in that the step-up/step-down circuit 240 and a protective diode 270 are connected between the direct current power source 220 and the antenna driving circuit 230. Other configurations are the same as those of Embodiment 1 described above, and thus will not be described again.

In Embodiment 3, the step-up/step-down circuit 240 steps up and down both outputs to the first connecting line 301 and to the second connecting line 302. Therefore, the ON voltage of the first antenna drive signal $V_{AC1}$ output to the first connecting line 301 is not maintained at the same value as the direct current power source voltage $V_{DC}$ as in Example 1. However, the antenna driving apparatus 200e of Example 3 is provided with the protective diode 270 connected between the step-up/step-down circuit 240 and the antenna driving circuit 230 instead of the capacitor. Therefore, the current caused by the direct current power source voltage $V_{DC}$ is prevented from flowing reversely toward the direct current power source 220 via the antenna driving circuit 230 as in Embodiment 1 described above. Consequently, the capacitor between the first connecting line 301 and the antenna driving circuit 230 is not necessary.

In Embodiment 3, the low-cost protective diode 270 may be used instead of the capacitor having a large capacitance, and thus a reduction in costs of the apparatus is achieved. In addition, by connecting the protective diode 270 to the direct current power source 220 side of the antenna driving circuit 230, the protective elements such as capacitors, which have to be provided at two positions; the first connecting line 301 and the second connecting line 302 in JP 2014-506306T for example, may be reduced to one. Therefore, further cost reduction of the apparatus is achieved.

As a consequence of the elimination of the capacitor, when the output to the vehicle-mounted apparatus 100 is switched from the antenna drive signal $V_{AC}$ to the direct current power source voltage $V_{DC}$, the antenna drive signal $V_{AC}$ charged in the capacitor is superimposed on the direct current power source voltage $V_{DC}$ and thus is not applied to the human detection IC 110 of the vehicle-mounted apparatus 100. Therefore, a rating of the human detection IC 110 may be lowered to achieve further reduction in costs of the apparatus.

When compared with Embodiment 1 described above, the ON voltage of the first antenna drive signal $V_{AC1}$ varies in accordance with variations in amplitude of the antenna drive signal $V_{AC}$ in Embodiment 3. Therefore, in the case where the antenna drive signal $V_{AC}$ is significantly higher than the direct current power source voltage $V_{DC}$, the configuration of Embodiment 3 disadvantageously needs to increase the rating of the human detecting IC so as to comply with the antenna drive signal $V_{AC}$. In contrast, however, step-up/step-down efficiency of the step-up/step-down circuit 240 is advantageously improved from (1+k)/2 times to k times. Therefore, the configuration of Embodiment 3 and the configuration of Embodiment 1 may be selectively employed in accordance with the object.

As described above, according to Embodiment 3, the protective diode connected to the step-up/step-down circuit and the antenna driving circuit is provided. Accordingly, since the current of the direct current power source voltage is prevented from flowing reversely toward the direct current power source via the antenna driving circuit, the capacitor does not have to be provided between the first connecting line and the antenna driving circuit. Consequently, a low-cost antenna driving apparatus capable of switchably outputting the direct current power source voltage and the antenna drive signal from the same connecting line without using a capacitor having a large capacitance is obtained.

Embodiment 4

Figure 10:
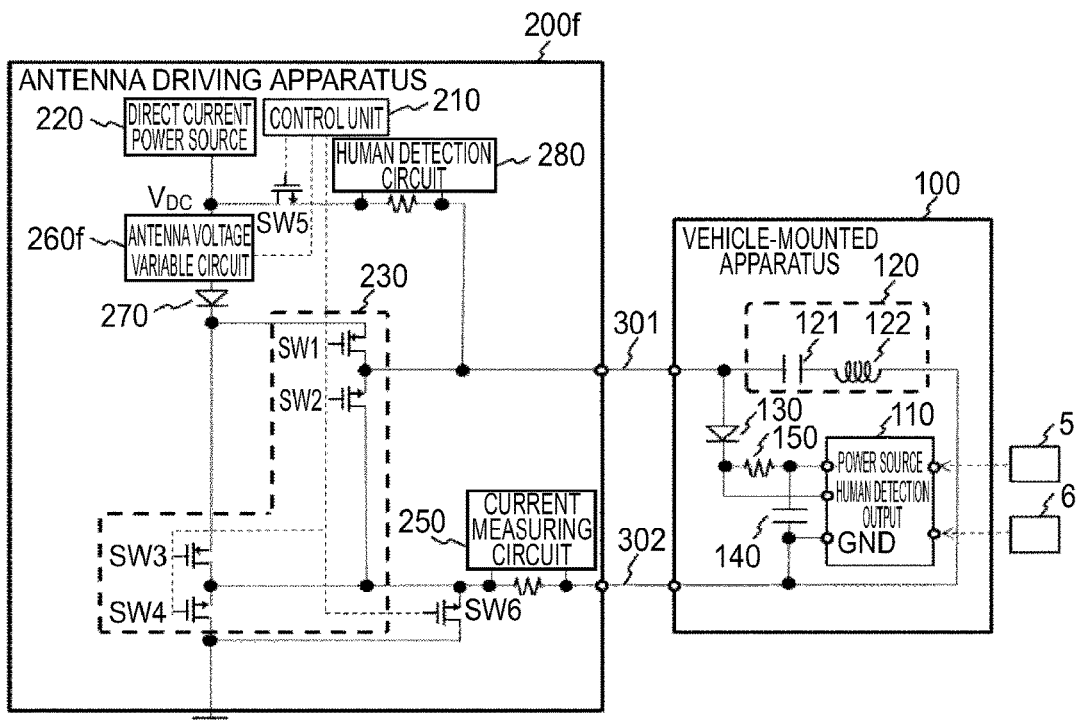
FIG. 10 is a schematic drawing illustrating a circuit configuration of an antenna driving apparatus according to Embodiment 4 disclosed here together with the vehicle-mounted apparatus.

FIG. 10 is a schematic drawing illustrating a circuit configuration of the antenna driving apparatus 200f according to Embodiment 4 disclosed here together with the vehicle-mounted apparatus 100. The antenna driving apparatus 200f of Embodiment 4 illustrated in FIG. 10 is different from the antenna driving apparatus 200e of Embodiment 3 described above as illustrated in FIG. 9 in that a current measuring circuit 250 and an antenna voltage variable circuit 260 are provided instead of the step-up/step-down circuit 240. Other configurations and operations are the same as those of Embodiment 3 described above, and thus will not be described again. Operations of the current measuring circuit 250 and the antenna voltage variable circuit 260 are the same as those of Embodiment 2 described above and thus will not be described.

The control unit 210 generates the antenna drive signals $V_{AC1}$ and $V_{AC2}$ to be output to the first connecting line 301 and the second connecting line 302 by performing the switching control of the voltage varied by the antenna voltage variable circuit 260 and the reference potential $V_{GND}$ to State 1 and State 2 in a resonance period of the antenna 120 in accordance with the logical value table shown in Table 1. Accordingly, for example, modulation of an amplitude of an output of the antenna 120 and suppression of overcurrent flowing in the antenna 120 are enabled.

As described above, according to Embodiment 4, the protective diode connected to the antenna voltage variable circuit and the antenna driving circuit is provided. The antenna drive signal to be output to the first connecting line and the second connecting line is generated by switching between the voltage varied by the antenna voltage variable circuit and the reference potential. Consequently, even though the amplitude of the antenna drive signal is temporarily varied to control a desired antenna current to flow to the antenna, the current caused by the direct current power source voltage is prevented from flowing reversely toward the direct current power source via the antenna driving circuit. Therefore, the low-cost antenna driving apparatus capable of switching the output from the same connecting line between the direct current power source voltage and the antenna drive signal is obtained without using a capacitor having a large capacitance.

Note that the current measuring circuit 250 does not necessarily have to be connected in series with the second connecting line 302 as illustrated in FIG. 10, and may be provided at other positions as long as the antenna current $I_{AC}$ can be measured in the same manner as Embodiment 2 described above. For example, the current measuring circuit 250 may be connected to the first connecting line 301 in series as illustrated in FIG. 6, may be connected to a power source line of the antenna driving circuit 230 in series as illustrated in FIG. 7, and may be connected to a ground line of the antenna driving circuit 230 in series as illustrated in FIG. 8.

The configuration of Embodiment 4 may concurrently employ the configuration of Embodiment 3 described above. In other words, if the antenna drive signal $V_{AC}$ is stepped up and down by using the step-up/step-down circuit 240 and then the antenna drive signal $V_{AC}$ is further varied by using the antenna voltage variable circuit 260, the output of the antenna drive signal $V_{AC}$ can be controlled further flexibly.

In contrast, the antenna voltage variable circuit 260 may be integrated with the step-up/step-down circuit 240 to achieve variable control of the step-up/step-down voltage performed by the step-up/step-down circuit 240, or the antenna voltage variable circuit 260 may be integrated with the antenna driving circuit 230 to achieve variable control of an ON resistance value and a Duty ratio of the switches SW1 to SW4 of the antenna driving circuit 230.

An antenna driving apparatus according to a first aspect of this disclosure includes: a direct current power source configured to supply direct current power to a human detecting IC configured to detect contact to a human detecting area of a vehicle by a user of the vehicle, the direct current power source outputting a direct current power source voltage to a first connecting line electrically connected to a power source terminal of the human detecting IC and outputting a reference potential to a second connecting line electrically connected to a GND terminal of the human detecting IC; an antenna driving circuit configured to drive an antenna that transmits a signal to a portable device carried by the user, the antenna driving circuit outputting a first antenna drive signal generated by switching between the direct current power source voltage and the reference potential to the first connecting line electrically connected to one end of the antenna and outputting a potential difference between a second antenna drive signal and the first antenna drive signal to be output to the second connecting line electrically connected to the other end of the antenna to the antenna as an antenna drive signal; and a control unit configured to perform switching control of the direct current power source voltage and the antenna drive signal to be output to the first connecting line and the second connecting line and to perform switching control of the antenna driving circuit.

The antenna driving apparatus according to the first aspect of this disclosure may further include a step-up/step-down circuit configured to step up and step down the direct current power source voltage and output a stepped-up and stepped-down voltage, and the antenna driving circuit may generate the second antenna drive signal to be output to the second connecting line by switching the stepped-up and stepped-down voltage and the reference potential.

The antenna driving apparatus according to the first aspect of this disclosure may further include a current measuring circuit configured to measure an antenna current flowing in the antenna; and an antenna voltage variable circuit configured to vary the direct current power source voltage or a stepped-up/stepped-down voltage so that a measured value of the antenna current becomes equal to a current value required by the antenna, and output a varied voltage, and the antenna driving circuit may generate the second antenna drive signal to be output to the second connecting line by switching the varied voltage and the reference potential.

An antenna driving apparatus according to a second aspect of this disclosure includes: a direct current power source configured to supply direct current power to a human detecting IC configured to detect contact to a human detecting area of a vehicle by a user of the vehicle, the direct current power source outputting a direct current power source voltage to a first connecting line electrically connected to a power source terminal of the human detecting IC and outputting a reference potential to a second connecting line electrically connected to a GND terminal of the human detecting IC; an antenna driving circuit configured to drive an antenna that transmits a signal to a portable device carried by the user, the antenna driving circuit outputting an antenna drive signal to the first connecting line electrically connected to one end of the antenna and the second connecting line electrically connected to the other end of the antenna, a protective diode connected between the direct current power source and the antenna driving circuit and configured to prevent a current caused by the direct current power source voltage from flowing reversely toward the direct current power source via the antenna driving circuit; and a control unit configured to perform switching control of the direct current power source voltage and the antenna drive signal to be output to the first connecting line and the second connecting line and to perform switching control of the antenna driving circuit.

The antenna driving apparatus according to the second aspect of this disclosure may further include a step-up and step-down circuit configured to step up and step down the direct current power source voltage and output a stepped-up and stepped-down voltage, the antenna driving circuit may generate the antenna drive signal to be output to the first connecting line and the second connecting line by switching the stepped-up and stepped-down voltage and the reference potential, and the protective diode may be connected between the step-up/step-down circuit and the antenna driving circuit and configured to prevent a current caused by the direct current power source voltage from flowing reversely to the step-up/step-down circuit via the antenna driving circuit.

The antenna driving apparatus according to the second aspect of this disclosure may further include a current measuring circuit configured to measure an antenna current flowing in the antenna; and an antenna voltage variable circuit configured to vary the direct current power source voltage or a stepped-up/stepped-down voltage so that a measured value of the antenna current becomes equal to a current value required by the antenna and to output a varied voltage, the antenna driving circuit generates the antenna drive signal to be output to the first connecting line and the second connecting line by switching the varied voltage and the reference potential, and the protective diode may be connected between the antenna voltage variable circuit and the antenna driving circuit and configured to prevent a current caused by the direct current power source voltage from flowing reversely to the antenna voltage variable circuit via the antenna driving circuit.

In the antenna driving apparatus according to the second aspect of this disclosure, the current measuring circuit may be connected to the first connecting line or the second connecting line in series, and a damping resistance for regulating impedance of the antenna connected to the first connecting line or to the second connecting line in series is concurrently used as a resistance for measuring the antenna current.

In the antenna driving apparatus according to the first or second aspect of this disclosure, the direct current power source voltage and the antenna drive signal may be output to the human detecting IC configured to continue an operation by using the antenna drive signal as a power source when the direct current power source voltage is not supplied.

According to the first aspect of this disclosure, the antenna drive signal to be output to the first connecting line, from which the direct current power source voltage and the antenna drive signal are switchably output, is generated by performing switching control of the direct current power source voltage and the reference potential. Accordingly, even though the amplitude of the antenna drive signal changes, ON voltage of the antenna drive signal output to the first connecting line is maintained at the same value as the direct current power source voltage that the direct current power source outputs. Therefore, the capacitor does not have to be provided between the first connecting line and the antenna driving circuit.

According to the second aspect of this disclosure, a protective diode connected between the direct current power source and the antenna driving circuit is provided. Accordingly, since the current of the direct current power source voltage is prevented from flowing reversely toward the direct current power source via the antenna driving circuit, the capacitor does not have to be provided between the first connecting line and the antenna driving circuit.

Consequently, a low-cost antenna driving apparatus capable of switchably outputting the direct current power source voltage and the antenna drive signal from the same connecting line without using a capacitor having a large capacitance can be obtained.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An antenna driving apparatus comprising:
   a direct current power source configured to supply direct current power to a human detecting integrated circuit (IC) configured to detect contact to a human detecting area of a vehicle by a user of the vehicle, the direct current power source outputting a direct current power source voltage to a first connecting line electrically connected to a power source terminal of the human detecting IC and outputting a reference potential to a second connecting line electrically connected to a GND terminal of the human detecting IC;
   an antenna driving circuit configured to drive an antenna that transmits a signal to a portable device carried by the user, the antenna driving circuit:
      outputting an antenna drive signal generated by switching between a first state in which the direct current power source voltage is output to the first connecting line electrically connected to one end of the antenna and the reference potential is output to the second connection line electrically connected to the other end of the antenna and a second state in which the direct current power source voltage is output to the second connecting line and the reference potential is output to the first connecting line; and
   a control unit configured to:
      perform switching between a state in which the direct current power source voltage is supplied to the human detecting IC by outputting the direct power source voltage to the first connecting line and outputting the reference potential to the second connecting line and a state in in which the antenna drive signal is output to the antenna, and
      perform switching control of the antenna driving circuit.

2. The antenna driving apparatus according to claim 1, further comprising:
   a step-up/step-down circuit configured to step up and step down the direct current power source voltage and output a stepped-up and stepped-down voltage,
   wherein the second state of the antenna driving circuit is a state in which the stepped-up and stepped-down voltage is output to the second connecting line and the reference potential is output to the first connecting line.

3. The antenna driving apparatus according to claim 1, further comprising:
   a current measuring circuit configured to measure an antenna current flowing in the antenna; and
   an antenna voltage variable circuit configured to:

vary the direct current power source voltage or a stepped-up/stepped-down voltage so that a measured value of the antenna current becomes equal to a current value required by the antenna, and output a varied voltage, wherein the second state of the antenna driving circuit is a state in which the varied voltage is output to the second connecting line and the reference potential is output to the first connecting line.

4. The antenna driving apparatus according to claim 3, wherein the current measuring circuit is connected to the first connecting line or the second connecting line in series, and a damping resistance for regulating impedance of the antenna connected to the first connecting line or to the second connecting line in series is concurrently used as a resistance for measuring the antenna current.

5. The antenna driving apparatus according to claim 1, wherein the direct current power source voltage and the antenna drive signal are output to the human detecting IC configured to continue an operation by using the antenna drive signal as a power source when the direct current power source voltage is not supplied.

6. The antenna driving apparatus according to claim 2, wherein the stepped-up and stepped-down voltage is only output to the second connecting line.

* * * * *